(12) United States Patent
Yasuda

(10) Patent No.: US 12,040,044 B2
(45) Date of Patent: Jul. 16, 2024

(54) SEMICONDUCTOR DEVICE AND MEMORY SYSTEM

(71) Applicant: KIOXIA CORPORATION, Tokyo (JP)

(72) Inventor: Yohei Yasuda, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 39 days.

(21) Appl. No.: 17/895,956

(22) Filed: Aug. 25, 2022

(65) Prior Publication Data

US 2023/0267978 A1    Aug. 24, 2023

(30) Foreign Application Priority Data

Feb. 22, 2022    (JP) .................................. 2022-026051

(51) Int. Cl.
  *G11C 7/22* (2006.01)
  *G11C 7/10* (2006.01)

(52) U.S. Cl.
  CPC .............. *G11C 7/22* (2013.01); *G11C 7/1012* (2013.01); *G11C 7/1039* (2013.01)

(58) Field of Classification Search
  CPC ....... G11C 7/22; G11C 7/1012; G11C 7/1039; G11C 29/023; G11C 2207/2254; G11C 29/50012; G11C 29/028; G11C 7/04; G11C 7/1066; G11C 7/1093; G11C 7/222
  See application file for complete search history.

(56) References Cited

U.S. PATENT DOCUMENTS

| 6,417,715 | B2 | 7/2002 | Hamamoto et al. | |
|---|---|---|---|---|
| 7,035,366 | B2 * | 4/2006 | Tokutome | G11C 7/22 |
| | | | | 327/146 |
| 7,477,083 | B2 | 1/2009 | Fujisawa et al. | |

(Continued)

FOREIGN PATENT DOCUMENTS

| JP | 4443728 B2 | 3/2010 |
|---|---|---|
| JP | 4879555 B2 | 2/2012 |
| JP | 2019050528 A | 3/2019 |

OTHER PUBLICATIONS

J.W. Lee, et al., "A 1.8 GB/s/pin 16Tb NAND Flash Memory Multi-chip Package with F-chip of Toggle 4.0 Specification for High performance and High capacity Storage Systems" Flash Memory Design Team, Samsung Electronics, Hwasung, Gyeonggi-do, Korea, 2020 IEEE Symposium on VLSI Circuits, Jun. 16-19, 2020, 2 pages. DOI: 10.1109/VLSICircuits18222.2020.9163052.

*Primary Examiner* — Jay W. Radke
(74) *Attorney, Agent, or Firm* — Kim & Stewart LLP

(57) ABSTRACT

A semiconductor device includes: a drift detection circuit that retrieves a previously-determined first delay amount of a reference signal passing through a circuit element at a first timing, determines a second delay amount of the reference signal passing through the circuit element at a second timing, and outputs a drift amount that is a difference between the first and second delay amounts; and a delay amount adjustment circuit that retrieves a previously-determined third delay amount of a first signal transmitted to an external device at the first timing, determines a fourth delay amount based on the third delay amount and the drift amount as a delay amount to be applied to the first signal in a period after the second timing, and transmits the first signal to which the fourth delay amount has been applied, to the external device.

20 Claims, 14 Drawing Sheets

(56) References Cited

U.S. PATENT DOCUMENTS

| | | | |
|---|---|---|---|
| 9,916,888 B1* | 3/2018 | Shin | G11C 29/12015 |
| 2006/0145745 A1* | 7/2006 | Deivasigamani | H03K 5/1565 |
| | | | 327/291 |
| 2007/0152723 A1 | 7/2007 | Ahn et al. | |
| 2019/0081631 A1 | 3/2019 | Nakata | |
| 2022/0006461 A1* | 1/2022 | Choi | H03L 7/0814 |

* cited by examiner

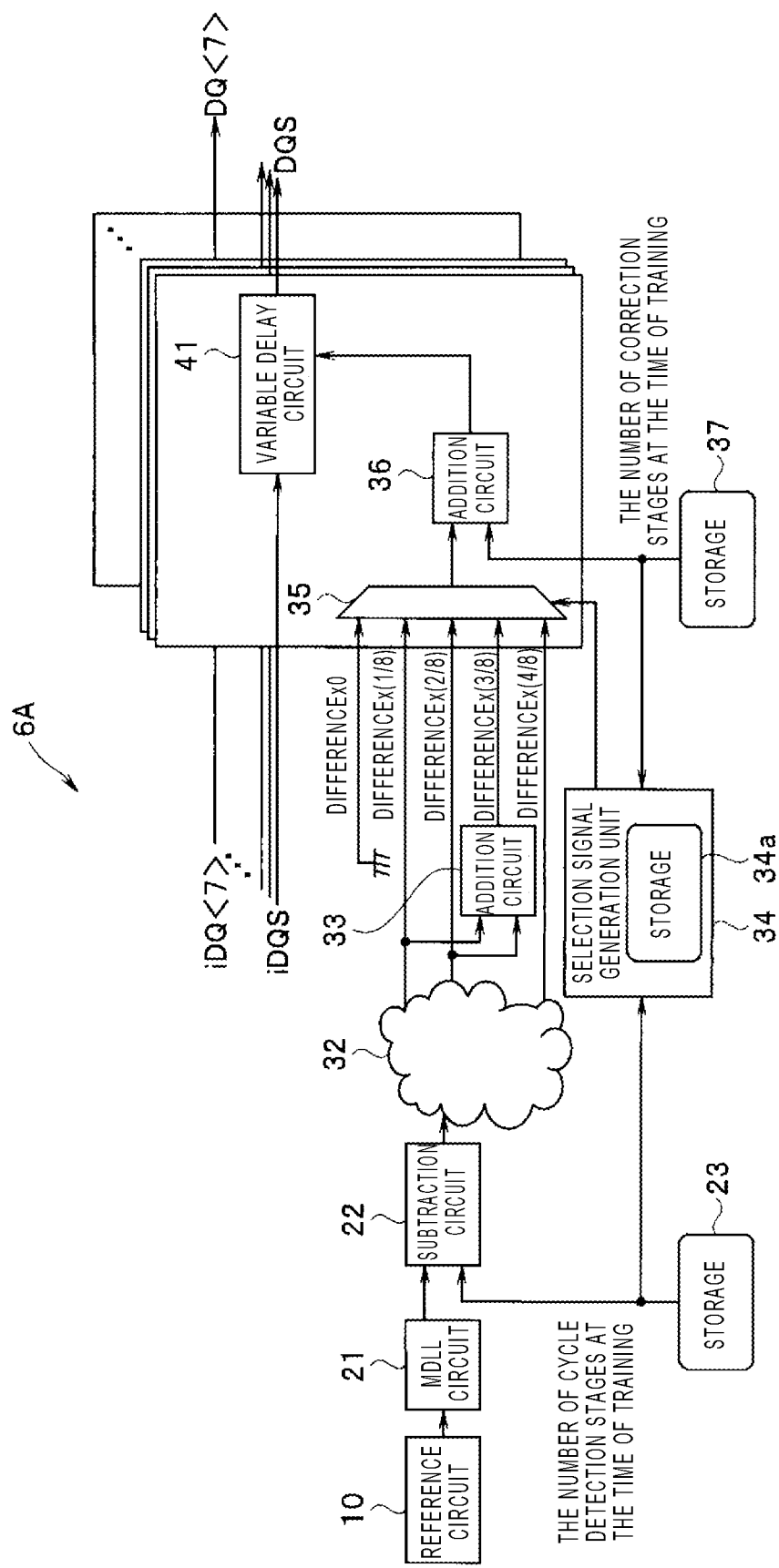

FIG.7

|  |  | AT THE TIME OF TRAINING | AFTER TEMPERATURE AND VOLTAGE HAVE DRIFTED | |
|---|---|---|---|---|
|  |  | NO DRIFT | BEFORE DRIFT COMPENSATION | AFTER DRIFT COMPENSATION |
| VARIABLE DELAY CIRCUIT | DELAY SET VALUE | 100 | 100 ----→ | 88 |
|  | DELAY AMOUNT | 188ps | 212ps | 186ps |
| MDLL CIRCUIT | CLOCK CYCLE | 833ps |  | 833ps |
|  | DETECTED VALUE | 444 ---- | -51 → | 393 |

Annotations: -12 ; ×(100/444)

FIG.8

|  |  | AT THE TIME OF TRAINING | AFTER TEMPERATURE AND VOLTAGE HAVE DRIFTED | |
|---|---|---|---|---|
|  |  | NO DRIFT | BEFORE DRIFT COMPENSATION | AFTER DRIFT COMPENSATION |
| VARIABLE DELAY CIRCUIT | DELAY SET VALUE | 100 | 100 ----→ | 87 |
|  | DELAY AMOUNT | 188ps | 212ps | 184ps |
| MDLL CIRCUIT | CLOCK CYCLE | 833ps |  | 833ps |
|  | DETECTED VALUE | 444 ---- | -51 → | 393 |

Annotations: -13 ; ×(100/444) → ×(2/8)

SEMICONDUCTOR DEVICE AND MEMORY SYSTEM

CROSS-REFERENCE TO RELATED APPLICATION(S)

This application is based upon and claims the benefit of priority from Japanese Patent Application No. 2022-026051, filed Feb. 22, 2022, the entire contents of which are incorporated herein by reference.

FIELD

Embodiments described herein relate generally to a semiconductor device and a memory system.

BACKGROUND

A controller of a memory system has a timing adjustment function for correcting a delay amount of a signal. When a temperature or a voltage is changed, the delay amount of the signal is changed. Thus, it is necessary to perform a drift compensation operation to re-adjust the timing according to the changed delay amount. However, when the drift compensation operation takes a long time, the data transfer efficiency is lowered when the drift compensation operation of a selected channel is performed.

DESCRIPTION OF THE DRAWINGS

FIG. 3 is a block diagram illustrating an example of a detailed configuration of the timing adjustment circuit according to the first embodiment.

FIG. 7 is a view illustrating a calculation method of a drift compensation amount according to the first embodiment.

FIG. 8 is a view illustrating a method for reducing a calculation amount when calculating the drift compensation amount according to the first embodiment.

DETAILED DESCRIPTION

Embodiments provide a semiconductor device and a memory system capable of performing a drift compensation operation without lowering data transfer efficiency.

In general, according to one embodiment, a semiconductor device includes a drift detection circuit, and a delay amount adjustment circuit. The drift detection circuit retrieves a previously-determined first delay amount of a reference signal passing through a circuit element at a first timing, determines a second delay amount of the reference signal passing through the circuit element at a second timing after the first timing, and outputs a drift amount that is a difference between the first delay amount and the second delay amount. The delay amount adjustment circuit retrieves a previously-determined third delay amount of a first signal transmitted to an external device of the semiconductor device at the first timing, determines a fourth delay amount based on the third delay amount and the drift amount as a delay amount to be applied to the first signal in a period after the second timing, and transmits the first signal to which the fourth delay amount has been applied, to the external device.

Hereinafter, embodiments will be described with reference to drawings.

First Embodiment

Figure 1:
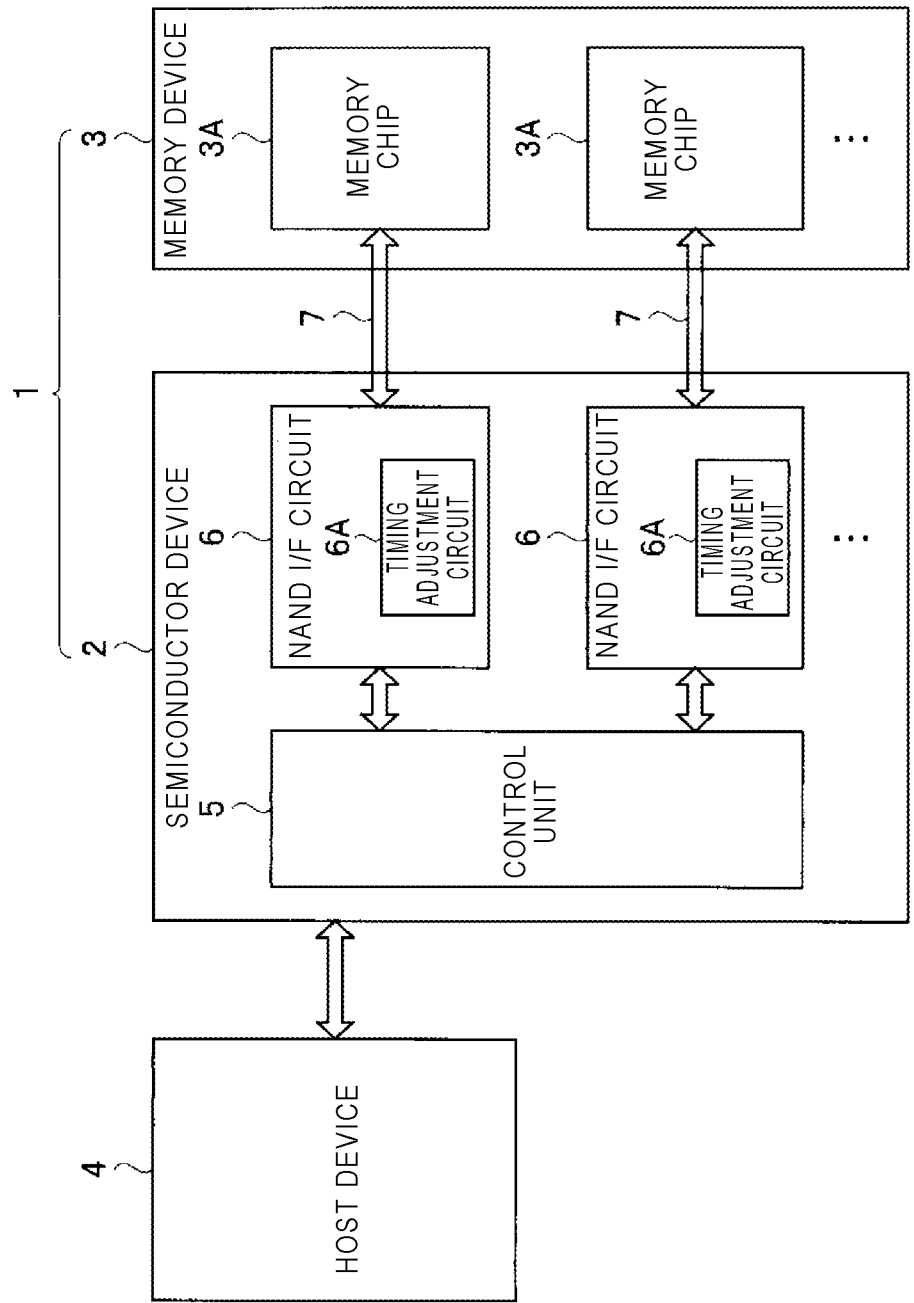
FIG. 1 is a block diagram illustrating a configuration of a memory system connected to a host, according to a first embodiment.

FIG. 1 is a block diagram illustrating a configuration of a memory system connected to a host, according to a first embodiment. As illustrated in FIG. 1, a memory system 1 includes a semiconductor device 2 and a memory device 3. The memory system 1 may be connected to a host device 4. The host device 4 is, for example, an electronic device such as a personal computer or a mobile terminal.

The memory device 3 is, for example, a non-volatile memory such as a NAND flash memory. Hereinafter, the memory device 3 is referred to as a NAND flash memory 3. The NAND flash memory 3 includes one or more memory chips 3A.

The semiconductor device 2 may be implemented as a circuit such as a system-on-a-chip (SoC). Each function of the semiconductor device 2 may be implemented by dedicated hardware, a processor that executes a program, or a combination thereof. The semiconductor device 2 functions as a memory controller configured to control the NAND flash memory 3. Hereinafter, the semiconductor device 2 is referred to as a memory controller 2. The memory controller 2 includes a control unit 5 and one or more NAND interface (I/F) circuits 6. The control unit 5 and the NAND I/F circuit 6 are connected to each other via a bus. The control unit 5 and the NAND I/F circuit 6 may be configured as independent semiconductor devices.

One or more NAND interface (I/F) circuits 6 and one or more memory chips 3A of the NAND flash memory 3 are electrically connected to each other via one or more channels 7, respectively. Each channel 7 has a configuration in which a plurality of signal wires are bundled. The memory controller 2 may individually control each channel 7. By individually controlling one or more channels 7, the memory controller 2 may simultaneously operate one or more memory chips 3A connected to different channels 7. The channel 7 in which data is transmitted/received between the memory controller 2 and the memory chip 3A is referred to as a selected channel. The channel 7 in which data is not transmitted/received between the memory controller 2 and the memory chip 3A is referred to as a non-selected channel.

The host device 4 and the memory controller 2 (more specifically, the control unit 5) are connected to each other via a predetermined interface. As the interface, for example, various interfaces such as a parallel interface of an embedded multimedia card (eMMC), a serial extension interface of peripheral component interconnected-express (PCIe), and a high-speed serial interface of M-PHY may be adopted. In each of the host device 4 and the memory controller 2, an interface circuit corresponding to the adopted interface among the various interfaces is built-in.

The host device 4 issues a write request or a read request to the control unit 5. According to the request from the host device 4, the control unit 5 controls writing data into the NAND flash memory 3, and reading data from the NAND flash memory 3.

The NAND I/F circuit 6 electrically connects the memory controller 2 and the NAND flash memory 3. The NAND I/F circuit 6 complies with various interface standards such as a toggle double data rate (Toggle DDR) and an open NAND flash interface (ONFI).

The memory controller 2 (more specifically, the NAND I/F circuit 6) and the NAND flash memory 3 transmit/receive various signals via a plurality of signal wires provided in the channel 7. The various signals include, for example, eight data signals DQ<7:0>, and two data strobe signals DQS and DQSn. The eight data signals DQ<7:0> include, for example, commands, addresses, data, and status. The various signals transmitted/received between the memory controller 2 and the NAND flash memory 3 may further include a chip enable signal CEn, a ready/busy signal RBn, a command latch enable signal CLE, an address latch enable signal ALE, a write enable signal WEn, read enable signals RE and REn, and a write protect signal WPn. Here, "n" added to the name of the signal indicates that the signal is an active-low signal.

The NAND I/F circuit 6 includes a timing adjustment circuit 6A. The timing adjustment circuit 6A performs timing adjustment of various signals such as the data signals DQ<7:0> or the data strobe signals DQS and DQSn.

The timing adjustment circuit 6A according to the embodiment is not only applied to the NAND I/F circuit 6, but also to various interface circuits built in the NAND flash memory 3 and the host device 4.

Next, a configuration of the timing adjustment circuit will be described.

Figure 2:
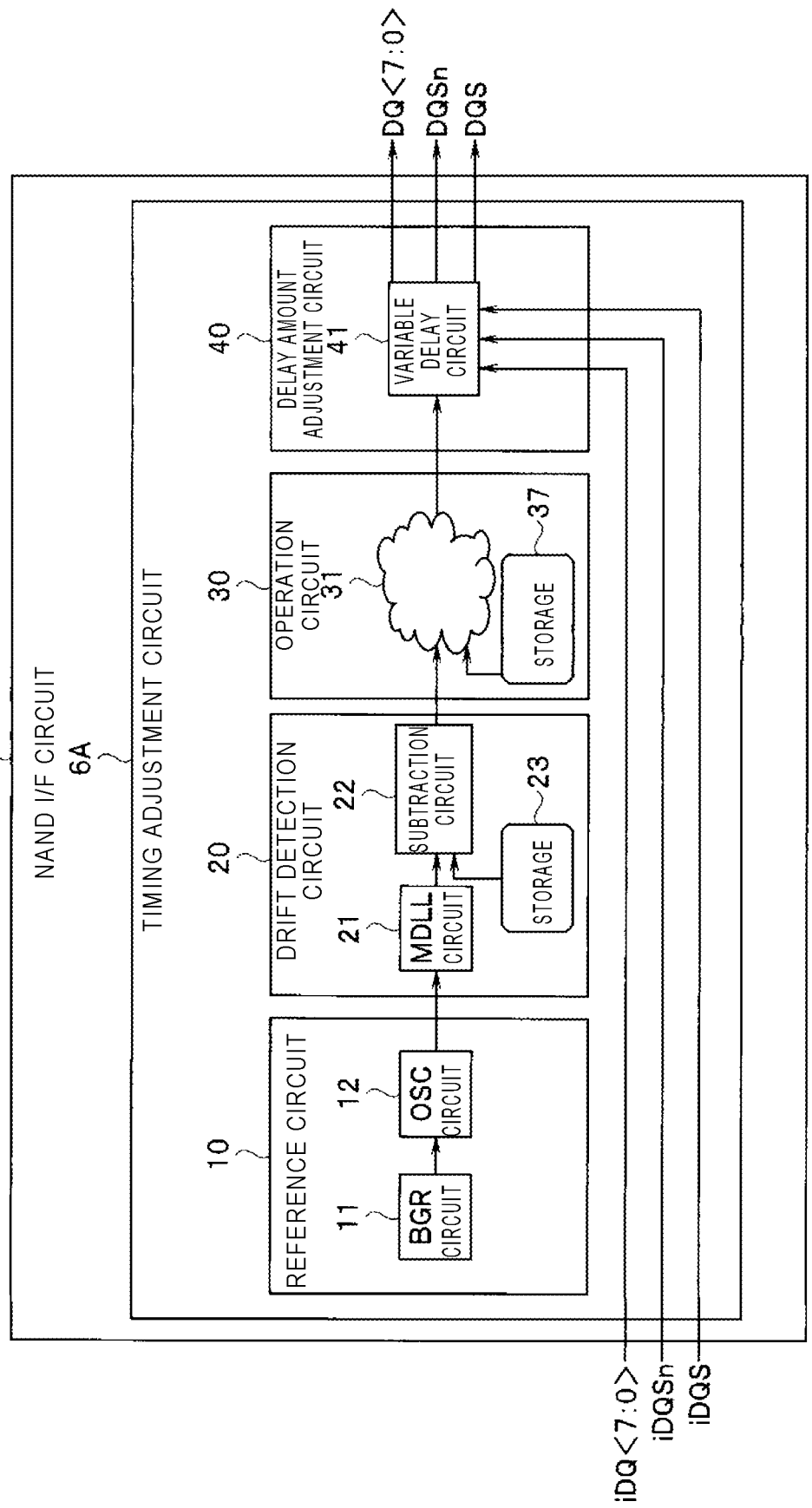
FIG. 2 is a block diagram illustrating an example of a configuration of a timing adjustment circuit according to the first embodiment.
Figure 4A:
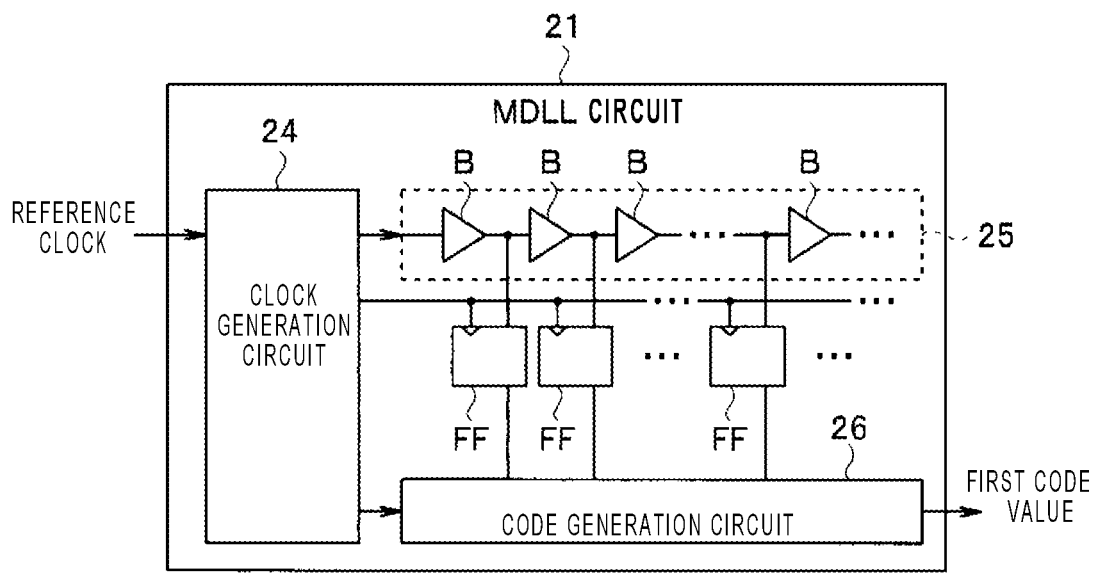
FIG. 4A is a block diagram illustrating an example of a master delay locked loop circuit (MDLL circuit) according to the first embodiment.
Figure 4B:
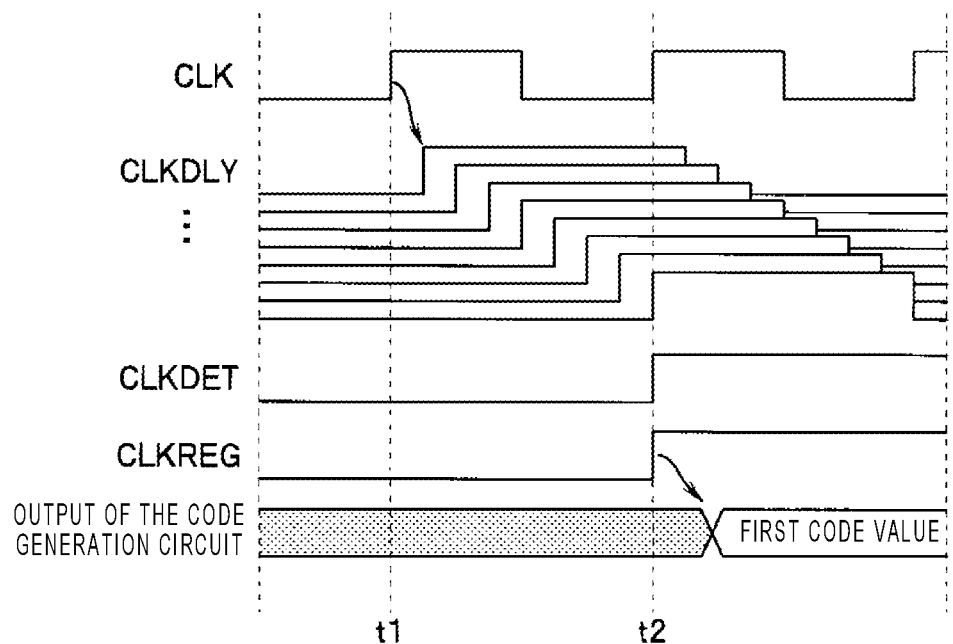
FIG. 4B is a timing chart illustrating an example of an operation of the MDLL circuit according to the first embodiment.
Figure 5:
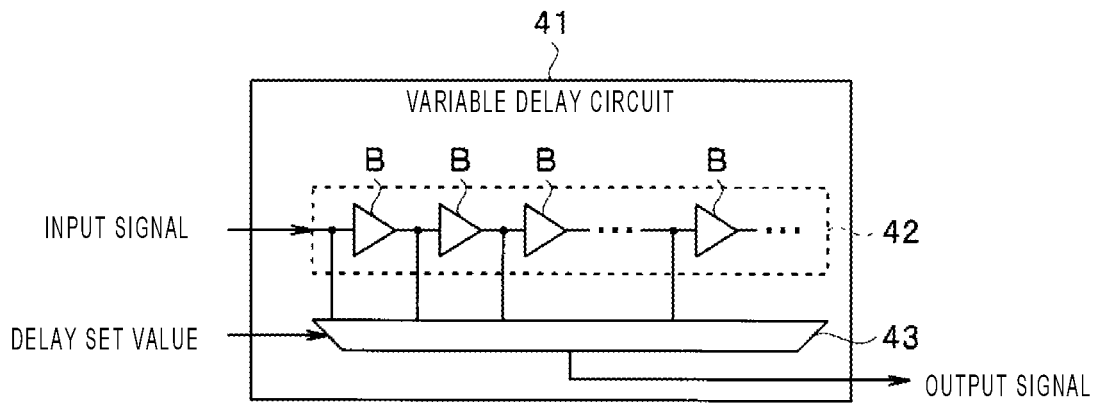
FIG. 5 is a block diagram illustrating an example of a configuration of a variable delay circuit according to the first embodiment.

FIG. 2 is a block diagram illustrating an example of a configuration of the timing adjustment circuit 6A according to the first embodiment. FIG. 3 is a block diagram illustrating an example of a detailed configuration of the timing adjustment circuit 6A according to the first embodiment. FIG. 4A is a block diagram illustrating an example of a master delay locked loop circuit (MDLL circuit) according to the first embodiment. FIG. 4B is a timing chart illustrating an example of an operation of the MDLL circuit according to the first embodiment. FIG. 5 is a block diagram illustrating an example of a configuration of a variable delay circuit according to the first embodiment.

As illustrated in FIG. 2, the timing adjustment circuit 6A includes a reference circuit 10, a drift detection circuit 20, an operation circuit 30, and a delay amount adjustment circuit 40. The timing adjustment circuit 6A adds a delay to each of internal data signals iDQ<7:0>, and internal data strobe signals iDQS and iDQSn that are input from the control unit 5 to output to the NAND flash memory 3 as the data signals DQ<7:0>, and the data strobe signals DQS and DQSn.

The reference circuit 10 generates a reference clock. The drift detection circuit 20 detects a drift amount based on the reference clock from the output of the reference circuit 10. The operation circuit 30 calculates a delay set value for setting a delay amount of various signals according to the drift detection result of the drift detection circuit 20. The delay amount adjustment circuit 40 adjusts the delay amount according to the delay set value calculated by the operation circuit 30.

The reference circuit 10 includes a band gap reference (BGR) circuit 11 and an oscillator (OSC) circuit 12. Even when the voltage or the temperature changes, the BGR circuit 11 outputs a constant voltage to the OSC circuit 12 as long as the change is within a predetermined range. The OSC circuit 12 generates a clock according to the input voltage. Therefore, the reference circuit 10 generates a reference clock independent of changes in voltage and temperature, and outputs the reference clock to the drift detection circuit 20.

The drift detection circuit 20 includes a master delay locked loop (DLL) circuit 21, a subtraction circuit 22, and a storage 23. In the following description, the master DLL circuit 21 is abbreviated as an MDLL circuit 21.

As illustrated in FIG. 4A, the MDLL circuit 21 is implemented as a time-to-digital converter (TDC) circuit. The MDLL circuit 21 includes a clock generation circuit 24, a delay line 25, a plurality of flip-flops FF, and a code generation circuit 26. The delay line 25 includes a plurality of buffers B connected to each other in series. The buffer B is an example of a circuit element. Further, the buffer B is an example of a delay element. A plurality of buffers B in the delay line 25 is an example of a plurality of first delay elements. The plurality of flip-flops FF are connected to the respective output ends of the plurality of buffers B.

As illustrated in FIG. 4B, at the time of training, a preparation period before data transfer, or every predetermined cycle during the data transfer (e.g., every 64 cycles of the reference clock CLK), the clock generation circuit 24 changes, at a timing t1 at which a first rising edge of the reference clock CLK input, a signal CLKDLY from a low level to a high level (or from a high level to a low level) that is input to the delay line 25. The signal CLKDLY input to the delay line 25 is delayed by the buffer B, and then, input to the buffer B and the flip-flop FF in the subsequent stage. That is, a deviation amount between signals CLKDLY illustrated in FIG. 4B indicates the delay amount for one stage of the buffer B. In the example illustrated in FIG. 4B, the clock generation circuit 24 inputs the signal CLKDLY changed from a low level to a high level to the delay line 25. The high level period of the signal CLKDLY is equal to one cycle of the reference clock CLK, but may be longer than one cycle.

Further, at a timing t2 at which a rising edge after the first rising edge of the reference clock CLK input at the time of training, the preparation period before data transfer, and every predetermined cycle during the data transfer is detected, the clock generation circuit 24 starts a clock CLKDET supplied to each flip-flop FF. At the rising edge of the supplied clock CLKDET, each flip-flop FF latches the signal CLKDLY from the buffer B connected to each flip-flop FF, and outputs the latched signal CLKDLY to the code generation circuit 26.

For example, when the signal CLKDLY input to the delay line 25 is changed from the low level to the high level, the signal CLKDLY at the high level input to the delay line 25 is delayed by the buffer B in the first stage and output to the buffer B in a second stage. The signal CLKDLY at the high level input to the buffer B in the second stage is delayed by the buffer B in the second stage and output to the buffer B in a third stage. Hereinafter, similarly, the signal CLKDLY at the high level input to a certain buffer B is delayed by the buffer B and output to the buffer B in the subsequent stage. That is, from the buffer B through which the signal CLKDLY at the high level input to the delay line 25 has passed, the signal CLKDLY at the high level is output. Meanwhile, from the buffer B through which the signal CLKDLY at the high level input to the delay line 25 has not yet passed, the signal CLKDLY at the low level is output.

As described above, the clock CLKDET supplied to each flip-flop FF rises at the timing t2. As a result, the flip-flop FF connected to the buffer B that has output the signal CLKDLY at the high level before one cycle of the reference clock CLK (i.e., before the timing t2) latches the signal CLKDLY at the high level according to the clock CLKDET. Meanwhile, the flip-flop FF connected to the buffer B that has not output the signal CLKDLY at the high level before one cycle of the reference clock CLK (i.e., before the timing t2) latches the signal CLKDLY at the low level according to the clock CLKDET. Each flip-flop FF outputs the latched signal CLKDLY to the code generation circuit 26.

Further, the clock generation circuit 24 outputs a signal CLKREG at a high level to the code generation circuit 26 at the timing t2 for the code generation circuit 26 to output a first code value. The clock generation circuit 24 may output the signal CLKREG at the high level to the code generation circuit 26 at the rising edge of the reference clock CLK after the timing t2.

When the signal CLKREG at the high level for outputting the first code value is input from the clock generation circuit 24, the code generation circuit 26 observes the level of the signal input from each flip-flop FF and counts the number of the flip-flops FF that output the signal at the high level (or the low level). Thus, it is determined to which stage of the buffer B the signal input to the delay line 25 has passed. The code generation circuit 26 generates the first code value indicating how many stages of the buffer B in the delay line 25 corresponds to one cycle of the reference clock based on the determination result. By the MDLL circuit 21 performing the above-described operations at the second timing (e.g., the preparation period before the data transfer, or a predetermined cycle during the data transfer) after the first timing (e.g., at the time of training), the first code value can indicate that how many stages of the buffer B in the delay line 25 corresponds to one cycle of the reference clock at the second timing as well as the first timing. The first code value is an example of a second set value. The code generation circuit 26 outputs the generated first code value to the subtraction circuit 22.

As illustrated in FIG. 2, the first code value from the MDLL circuit 21 and a second code value from the storage 23 are input to the subtraction circuit 22. The second code value is a code value indicating the number of the cycle detection stages at the time of training, specifically, how many stages of the buffer B in the delay line 25 corresponds to one cycle of the reference clock at the time of training. The second code value indicates how many stages of the buffer B in the delay line 25 corresponds to one cycle of the reference clock at the first timing (e.g., at the time of training). The second code value is an example of a first set value. Details of the training will be described later.

The subtraction circuit 22 calculates the difference between the first code value from the MDLL circuit 21 and the second code value from the storage 23. That is, the subtraction circuit 22 calculates the difference between the number of the buffers B corresponding to one cycle of the current reference clock at a certain timing and the number of the buffers B corresponding to one cycle of the reference clock at the time of training. Therefore, the drift detection circuit 20 can detect the drift amount from the time of training. That is, the drift amount from the time of training is indicated by, for example, the difference in the number of the buffers B corresponding to one cycle of the reference clock. The drift detection circuit 20 outputs the detected drift amount to the operation circuit 30.

In this manner, the drift detection circuit 20 determines a first delay amount, which is the delay amount of the buffer B at the first timing. Further, the drift detection circuit 20 determines a second delay amount, which is the delay amount of the buffer B at the second timing after the first timing. Then, the drift detection circuit 20 detects the drift amount, which is the difference between the first delay amount and the second delay amount. In other words, the drift detection circuit 20 generates the reference signal (signal CLKDLY) having a first cycle, and determines the first delay amount or the second delay amount based on the time required for the reference signal to pass through a plurality of buffers B.

The operation circuit 30 includes a combination circuit 31 and a storage 37. As illustrated in FIG. 3, the combination circuit 31 includes a combination circuit 32, an addition circuit 33, a selection signal generation unit 34, a selector 35, and an addition circuit 36.

The combination circuit 32 performs a right-shift operation that shifts the output value from the subtraction circuit 22 to the right. In general, the value of a binary bit string becomes ½ times each time it is shifted to the right by 1 bit. As a result, the value of a binary bit string becomes ½ times when shifted to the right by 1 bit, becomes ¼ times when shifted to the right by 2 bits, and becomes ⅛ times when shifted to the right by 3 bits. When the combination circuit 32 shifts the output value from the subtraction circuit 22 to the right by 1 bit, the output value from the subtraction circuit 22 becomes 4/8 (½) times. When the combination circuit 32 shifts the output value from the subtraction circuit 22 to the right by 2 bits, the output value from the subtraction circuit 22 becomes 2/8 (¼) times. When the combination circuit 32 shifts the output value from the subtraction circuit 22 to the right by 3 bits, the output value from the subtraction circuit 22 becomes ⅛ times. Thus, the output value from the subtraction circuit 22 becomes ⅛ times, 2/8 times, and 4/8 times by the operation of the combination circuit 32, and is input to the selector 35. Further, the values that are ⅛ times and 2/8 times are input to the addition circuit 33. The addition circuit 33 adds the values that are ⅛ times and 2/8 times, calculates the value that is ⅜ times of the output value from the subtraction circuit 22, and outputs the value to the selector 35. Further, 0 (denoted as difference×0 in FIG. 3), which is a signal in a low level from the ground, is input to the selector 35. In this manner, the combination circuit 32 outputs a first difference value, which is the result of a bit-shift operation of the difference between the first code value and the second code value, to the delay amount adjustment circuit 40.

The selection signal generation unit 34 generates a selection signal for each signal (e.g., data signal DQ<7:0> and data strobe signals DQS and DQSn) based on the second code value (i.e., the number of the cycle detection stages at the time of training) from the storage 23, and the number of correction stages of each signal at the time of training from the storage 37. The number of the correction stages of each signal at the time of training will be described later. The selection signal generation unit 34 outputs the generated selection signal to the selector 35 provided for each of the data signals DQ<7:0> and the data strobe signals DQS and DQSn.

Specifically, when the value of the number of the correction stages of each signal at the time of training divided by the number of the cycle detection stages at the time of training is 0 or more, and less than 1/16, the selection signal generation unit 34 outputs the selection signal for the selector 35 to select a value of the difference×0 to the selector 35. Further, when the value of the number of the correction stages of each signal at the time of training divided by the number of the cycle detection stages at the time of training is 1/16 or more, and less than 3/16, the selection signal generation unit 34 outputs the selection signal for the selector 35 to select a value of the difference× 1/8 to the selector 35. Further, when the value of the number of the correction stages of each signal at the time of training divided by the number of the cycle detection stages at the time of training is 3/16 or more, and less than 5/16, the selection signal generation unit 34 outputs the selection signal for the selector 35 to select a value of the difference× 2/8 to the selector 35. Further, when the value of the number of the correction stages of each signal at the time of training divided by the number of the cycle detection stages at the time of training is 5/16 or more, and less than 7/16, the selection signal generation unit 34 outputs the selection signal for the selector 35 to select a value of the difference× 3/8 to the selector 35. Further, when the value of the number of the correction stages of each signal at the time of training divided by the number of the cycle detection stages at the time of training is 7/16 or more, the selection signal generation unit 34 outputs the selection signal for the selector 35 to select a value of the difference× 4/8 to the selector 35.

When it is necessary to generate a larger delay amount in a variable delay circuit 41, a value larger than the difference× 4/8, for example, the values of the difference× 5/8, the difference× 6/8, the difference× 7/8, and the difference× 8/8 may be generated by the combination circuit 32 and the addition circuit 33 and may be input to the selector 35. Then, the selection signal generation unit 34 outputs the selection signal for selecting a predetermined value to the selector 35 according to the value of the number of the correction stages of each signal at the time of training divided by the number of the cycle detection stages at the time of training. For example, when the value of the number of the correction stages of each signal at the time of training divided by the number of the cycle detection stages at the time of training is 15/16 or more, the selection signal generation unit 34 outputs the selection signal for the selector 35 to select a value of the difference×8/8 to the selector 35.

For example, when the number of the cycle detection stages at the time of training is 444, and the number of the correction stages of the data signal DQ<0> at the time of training is 100, the value of 100/444 is larger than 3/16, and less than 5/16. As a result, the selection signal generation unit 34 generates the selection signal for the selector 35 corresponding to the data signal DQ<0> to select the value of the difference× 2/8, and outputs the selection signal to the selector 35 corresponding to the data signal DQ<0>.

Further, for example, when the number of the cycle detection stages at the time of training is 444, and the number of the correction stages of the data signal DQ<1> at the time of training is 50, the value of 50/444 is larger than 1/16, and less than 3/16. As a result, the selection signal generation unit 34 generates the selection signal for the selector 35 corresponding to the data signal DQ<1> to select the value of the difference× 1/8, and outputs the selection signal to the selector 35 corresponding to the data signal DQ<1>.

The selection signal generation unit 34 includes a storage 34a. The number of the cycle detection stages at the time of training, and the number of the correction stages of each signal (data signals DQ<7:0>, data strobe signals DQS and DQSn) at the time of training are determined at the time of training. The selection signal generation unit 34 determines for each signal that which value of 0, 1/8, 2/8, 3/8, or 4/8 is close to the value of the number of the correction stages at the time of training divided by the number of the cycle detection stages at the time of training, and stores the information in the storage 34a. That is, the selection signal generation unit 34 stores in the storage 34a the information indicating which signal is selected for each selector 35. At the time of data transfer, the selection signal generation unit 34 outputs the selection signal to each selector 35, respectively, based on the information stored in the storage 34a. In this manner, the selection signal generation unit 34 performs quantization that approximates the value of the number of the correction stages of each signal at the time of training divided by the number of the cycle detection stages at the time of training to any one of the values of 0, 1/8, 2/8, 3/8, or 4/8. Then, the selection signal generation unit 34 outputs the selection signal to each selector 35 so that the difference obtained by multiplying the approximate value is selected.

The selector 35 is provided for each of the data signals DQ<7:0>, and the data strobe signals DQS and DQSn. The selection signal generated for each of the data signals DQ<7:0>, and the data strobe signals DQS and DQSn by the selection signal generation unit 34 is input to each selector 35. Based on the selection signal generated for each of the data signals DQ<7:0>, and the data strobe signals DQS and DQSn, each selector 35 selects any one of the input values and outputs the selected one to the addition circuit 36.

The addition circuit 36 is provided for each of the data signals DQ<7:0>, and the data strobe signals DQS and DQSn. Each addition circuit 36 adds the output of the selector 35 and the number of the correction stages (the number of the correction stages corresponding to each of the data signals DQ<7:0>, and the data strobe signals DQS and DQSn) at the time of training from the storage 37, and outputs a control code, which is the delay set value, to the delay amount adjustment circuit 40.

The delay amount adjustment circuit 40 includes the variable delay circuit 41 provided for each of the data signals DQ<7:0>, and the data strobe signals DQS and DQSn. Each variable delay circuit 41 delays each of the internal data signals iDQ<7:0> and the internal data strobe signals iDQS and iDQSn based on the delay set value from each addition circuit 36, and transmits the delayed signal to the NAND flash memory 3 as the data signals DQ<7:0>, and the data strobe signals DQS and DQSn.

As illustrated in FIG. 5, the variable delay circuit 41 includes a delay line 42 and a selector 43. The delay line 42 includes a plurality of buffers B connected to each other in series. A plurality of buffers B in the delay line 42 are an example of a plurality of second delay elements. The delay amount of each buffer B in the delay line 42 is equal to the delay amount of each buffer B in the delay line 25 of the MDLL circuit 21.

The input of the buffer B in the first stage in the delay line 42 is connected to one of the internal data signals iDQ<7:0>, and the internal data strobe signals iDQS and iDQSn. The output of each buffer B in the delay line 42 is connected to the selector 43.

The selector 43 selectively outputs any one of the input signal or the output of each buffer B in the delay line 42 based on the delay set value. That is, the selector 43 selectively outputs any one of the input signal or the output signal of each buffer B in the delay line 42 based on the delay set value. Therefore, the delay amount from the input signal to the output signal can be changed.

In this manner, the variable delay circuit 41 transmits a first signal (e.g., data signals DQ<7:0>, and data strobe signals DQS and DQSn) to an external device (e.g., the memory device 3) based on the set delay amount.

Next, training and a drift compensation operation will be described.

When data transfer is performed between the memory controller 2 and the NAND flash memory 3, training is performed before the data transfer. The training is performed, for example, at the time of a test before the shipment of a product. During the training, the memory controller 2 and the NAND flash memory 3 transmit/receive a determined test pattern, and the delay amount of each signal is determined so that the test pattern can correctly be transmitted/received. In the training, for example, the delay amount of each signal is determined so that each of the data signals DQ<7:0> has a sufficient timing margin for the data strobe signals DQS and DQSn.

Figure 6:
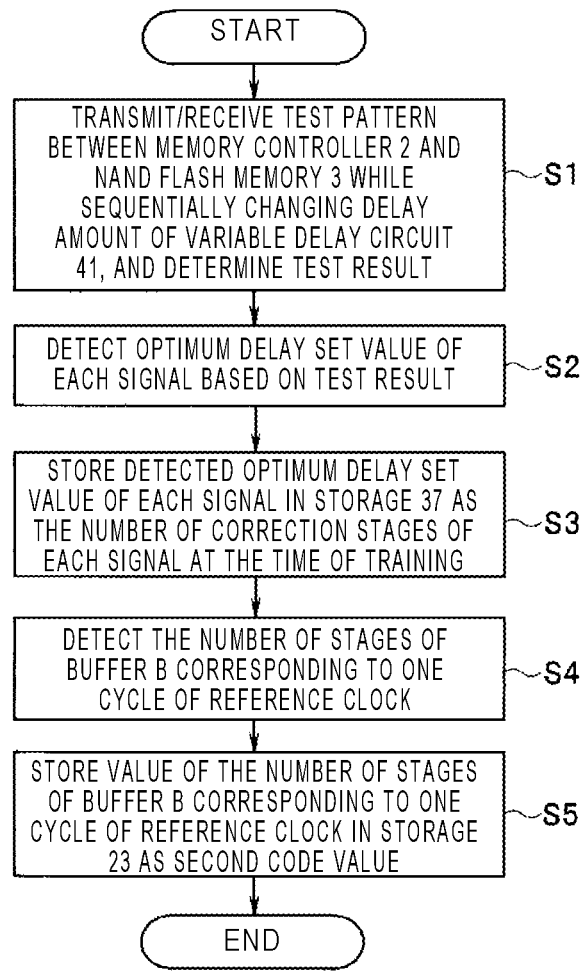
FIG. 6 is a flowchart illustrating an example of a processing flow at the time of training according to the first embodiment.

FIG. 6 is a flowchart illustrating an example of a processing flow at the time of training according to the first embodiment.

First, the control unit 5 transmits/receives the test pattern between the memory controller 2 and the NAND flash memory 3 while sequentially changing the delay amount of the variable delay circuit 41, and determines the test result (step S1).

Specifically, first, the control unit 5 sets the delay amount of the variable delay circuit 41 of each signal (e.g., data signals DQ<7:0>, and data strobe signals DQS and DQSn) to zero. Then, the control unit 5 transmits/receives the test pattern to/from the NAND flash memory 3 to determine an error or a pass. Next, the control unit 5 sets the delay amount of the variable delay circuit 41 of each signal to one stage of the buffer B in the delay line 42. Then, the control unit 5 transmits/receives the test pattern to/from the NAND flash memory 3 to determine an error or a pass. In this manner, the control unit 5 transmits/receives the test pattern between the memory controller 2 and the NAND flash memory 3 while sequentially changing the delay amount of each signal, and determines the test result.

Next, the control unit 5 detects an optimum delay set value of each signal based on the test result (step S2). For example, for the data signal DQ<0>, a case is assumed where the test result using the delay amount from zero to 75 stages of the buffer B in the delay line 42 is an error, the test result from 76 stages to 124 stages of the buffer B is a pass, and the test result of 125 stages or more of the buffer B is an error. In this case, the control unit 5 detects the median value from 76 stages to 124 stages of the buffer B in which the test result is a pass as the optimum value. That is, the control unit 5 detects 100 stages of the buffer B in the delay line 42 as the optimum delay set value for the data signal DQ<0>. Similarly, the control unit 5 detects the optimum delay set value for each of the data strobe signals DQS and DQSn, and the data signals DQ<7:1>.

In this manner, the delay amount adjustment circuit 40 determines a third delay amount, which is the delay amount of the first signal when the first signal transmitted to the external device of the semiconductor device 2 is received without an error in the external device. The third delay amount corresponds to an aggregate delay amount of the buffer(s) B in the delay line 42 through which the first signal passes, wherein the number of such buffer(s) B is equal to the delay set value set in the variable delay circuit 41 at the time of training. The delay amount adjustment circuit 40 sets the determined third delay amount as the delay amount of the first signal used in the period from the first timing to the second timing.

Further, the delay amount adjustment circuit 40 determines a fourth delay amount based on the third delay amount and the drift amount, and sets the determined fourth delay amount as the delay amount of the first signal used in the period after the second timing. The fourth delay amount corresponds to an aggregate delay amount of the buffer(s) B in the delay line 42 through which the first signal passes, wherein the number of such buffer(s) B is equal to the delay set value set in the variable delay circuit 41 at the time of data transfer. The delay amount adjustment circuit 40 determines the fourth set value based on the result obtained by adding the first difference value input from the operation circuit 30 (more specifically, the combination circuit 32) and the third set value.

Next, the control unit 5 stores the detected optimum delay set value of each signal in the storage 37 as the number of the correction stages of each signal at the time of training (step S3).

Next, the timing adjustment circuit 6A detects the number of the stages of the buffer B corresponding to one cycle of the reference clock in the delay line 25 (step S4). The number of the stages of the buffer B corresponding to one cycle of the reference clock is detected by the MDLL circuit 21. The timing adjustment circuit 6A can calculate the delay amount of one stage of the buffer B by this processing. Finally, the timing adjustment circuit 6A stores the detected value of the number of the stages of the buffer B corresponding to one cycle of the reference clock in the storage 23 as the second code value (i.e., the number of the cycle detection stages at the time of training) (step S5).

As a result of the training performed before the data transfer, for example, when it is detected that the delay amount of one stage of the buffer B is 1.88 ps, and setting the delay for 100 stages of the buffer B in the delay line 42 is optimum for the data signal DQ<0>, the optimum delay amount for the data signal DQ<0> is 188 ps. When the temperature and the voltage at the time of data transfer substantially equal to those at the time of training, it is possible to use the optimum delay amount (188 ps) by setting the same delay setting value.

Meanwhile, when the temperature or the voltage drifts from the time of training, due to the temperature and voltage dependence of the delay line 42, the optimum delay set values at the time of training and at the time of data transfer are not always the same.

For example, when the delay amount for one stage of the buffer B is changed from 1.88 ps to 2.12 ps due to the drift of the temperature or the voltage, while the delay set value is set to 100, the delay amount of the delay line 42 is 212 ps, which deviates from the optimum delay amount. As a result, it is necessary to change the delay set value input to the variable delay circuit 41 to correct the delay amount to be optimum. In this case, by reducing the delay set value from 100 to 88, the delay amount of the delay line 42 becomes 186 ps, and thus, the optimum delay amount can be given. This change amount of the delay set value (−12 in the example described above) corresponding to the optimum delay amount of the delay line 42 is referred to as a drift compensation amount. Further, an operation for calculating the drift compensation amount is referred to as a drift compensation operation.

Next, a method for calculating the drift compensation amount will be described. FIG. 7 is a view illustrating a calculation method of a drift compensation amount according to the first embodiment.

When the delay amount for one stage of the buffer B in the delay line 25 is 1.88 ps, the number of the stages of the buffer B corresponding to one cycle of the reference clock having a cycle of 833 ps is 444. The number of the stages of the buffer B corresponding to one cycle of the reference clock at the time of training is stored in the storage 23 as the number of the cycle detection stages at the time of training.

Further, it is assumed that the optimum delay amount of the variable delay circuit 41 of a certain signal (e.g., DQ<0>) at the time of training is 100 stages of the buffer B (i.e., 188 ps) in the delay line 42. In this training, the number (100) of the buffers B is stored in the storage 37 as the number of the correction stages of the signal at the time of training.

As described above, when the delay amount for one stage of the buffer B becomes 2.12 ps due to the drift of the temperature or the voltage, while the delay set value of the variable delay circuit 41 is the same, the delay amount becomes 212 ps. Here, when the MDLL circuit 21 detects again the number of the stages of the buffer B corresponding to one cycle of the reference clock which is independent of the temperature and voltage, since the delay amount for one stage of the buffer B increases, the detected value is decreased to 393. That is, the change amount of the detected value of the MDLL circuit 21 is −51 (=393−444).

The MDLL circuit 21 and the variable delay circuit 41 have the delay lines 25 and 42 including the buffer B having the same delay value. As a result, to generate the delay amount equal to the delay amount at the time of training for the variable delay circuit 41, it is necessary to reduce the number of the stages of the buffer B with the same ratio as the delay line 25 of the MDLL circuit 21.

Specifically, the drift compensation amount may be calculated by [the change amount of the detected value of the MDLL circuit 21]×([the delay set value of the variable delay circuit 41 at the time of training]/[the detected value of the MDLL circuit 21 at the time of training]). Here, the detected value of the MDLL circuit 21 at the time of training is the number of the cycle detection stages stored in the storage 23. The delay set value of the variable delay circuit 41 at the time of training is the number of the correction stages of the signal stored in the storage 37. In the example described above, the drift compensation amount is −51×(100/444)=−12. As a result, the delay set value of the variable delay circuit 41 after the drift compensation operation becomes 88, and the delay amount at this time becomes 186 ps.

Next, a method for reducing a calculation amount when calculating the drift compensation amount will be described. FIG. 8 is a view illustrating a method for reducing a calculation amount when calculating the drift compensation amount according to the first embodiment.

When it is necessary to calculate the drift compensation amount as illustrated in FIG. 7 at a high speed, it is necessary to implement a division circuit in the memory controller 2. However, in general, the size of the division circuit is large. Further, the division performed by a processor that executes a program takes a long time to calculate.

The memory controller 2 according to the embodiment includes a circuit configuration that shortens the processing (calculation) time until the drift compensation operation is completed. The memory controller 2 according to the embodiment may complete the drift compensation operation of the selected channel at a high speed, and thus, the lowering of the data transfer efficiency can be prevented.

Specifically, the memory controller 2 approximates (quantizes) the result of the division ([the delay set value of the variable delay circuit 41 at the time of training]/[the detected value of the MDLL circuit 21 at the time of training]) at the time of calculating the drift compensation amount to an integral multiple of "1/(a power of 2)" (i.e., N×½"). Therefore, the calculation time can be shortened without using the division circuit.

More specifically, as illustrated in FIG. 8, [the delay set value of the variable delay circuit 41 at the time of training]/[the detected value of the MDLL circuit 21 at the time of training] is not 100/444, but ⅖, that is, quantizes to ¼. By multiplying the obtained ¼ by −51, which is "the change amount of the detected value of the MDLL circuit 21", −13 is obtained. As described above, this calculation result is obtained by shifting the binary bit string corresponding to −51 of the decimal number to the right by 2 bits. In the addition circuit 36, the number of the correction stages at the time of training stored in the storage 37 and the obtained −13 are added, and thus, 87, which is the optimum delay set value at the time of data transfer is obtained. Therefore, the variable delay circuit 41 selects the buffer B in the 87th stage in the delay line 42, and outputs the signal in which the input signal is delayed to 184 ps.

In general, the numerical value input to an operation circuit is represented by a binary number, and thus, the calculation of "a power of 2" or "1/(a power of 2)" can be calculated by merely shifting each bit of the numerical value. Therefore, not only the calculation time can be shortened, but also the size of the circuit can largely be decreased.

In the calculation method illustrated in FIG. 7, the inaccuracy of the drift compensation amount can be reduced within the range of the delay amount for one stage of the buffer B. However, in this calculation method, a division circuit having a large size, and/or, a long calculation time are/is necessary.

With regard to this, in the calculation method illustrated in FIG. 8, the correction coefficient ([the delay set value of the variable delay circuit 41 at the time of training]/[the detected value of the MDLL circuit 21 at the time of training]) is approximated (quantized) to an integral multiple of "1/(a power of 2)". For the quantization, for example, a division such as 100/444 described above is necessary. In the embodiment, this division may be performed by a processor that executes a program at the time of training. Then, at the time of training, the correction coefficient quantized based on the result of the division is stored in the storage 34a. Therefore, at the time of data transfer, the drift compensation amount may be calculated by performing a right-shift operation of the output value of the subtraction circuit 22 based on the correction coefficient, or adding the result of a plurality of right-shift operations of the output value of the subtraction circuit 22. That is, the calculation time at the time of data transfer can be shortened.

The delay amount after the drift compensation amount is applied to the delay set value is 186 ps in the calculation method illustrated in FIG. 7, but 184 ps in the calculation method illustrated in FIG. 8. In the calculation method illustrated in FIG. 8, the inaccuracy of the optimum delay amount becomes larger than that of the calculation method illustrated in FIG. 7 due to the influence of the inaccuracy (quantization error) of the correction coefficient due to the quantization. However, as compared with 212 ps in a case before the drift compensation amount is applied, the inaccuracy of the optimum delay amount can be reduced by performing the drift compensation operation using the calculation method illustrated in FIG. 8.

In general, when retraining is performed for the drift compensation operation, it takes approximately several microseconds. Further, the channel between the memory controller 2 and the NAND flash memory 3 is occupied during the retraining, and thus, the data transfer efficiency is lowered. A method in which the drift compensation operation is performed using a non-selected channel is known, but the drift compensation operation for the selected channel itself cannot be performed in this method.

With regard to this, in the embodiment, the drift compensation operation can be performed at a high speed by using the calculation method described above. Specifically, the processing from the detection of the drift amount in the MDLL circuit 21 to the change of the delay set value of the variable delay circuit 41 can be completed in approximately 10 ns to 20 ns. In general, after the memory controller 2 issues a command to the NAND flash memory 3, the preparation period of 200 ns to 300 ns is necessary due to an operation in the NAND flash memory 3 until the data transfer between the memory controller 2 and the NAND flash memory 3 becomes possible. According to the configuration of the NAND I/F circuit 6 according to the embodiment, the drift compensation operation may be performed in the preparation period before the data transfer even in the selected channel. As a result, in the memory system 1 according to the embodiment, it is possible to perform the drift compensation operation of the selected channel without lowering the data transfer efficiency.

The timing adjustment circuit 6A according to the embodiment has a resolution of quantizing the correction coefficient of ⅛, but the resolution may be other values as long as it is "1/(a power of 2)", for example, ¼, 1/16, or 1/32. In general, when the resolution of quantizing is changed from ⅛ to 1/16, the inaccuracy due to the quantization of the correction coefficient is reduced, but the size of the circuit configured to calculate the correction coefficient increases. Specifically, when the resolution of quantizing is ⅛, as illustrated in FIG. 3, the addition circuit 33 configured to calculate the correction coefficient of ⅜ is necessary. Meanwhile, when the resolution of quantizing is 1/16, addition circuits configured to calculate the correction coefficient of 3/16, 5/16, 6/16, and 7/16 are necessary. As a result, the optimum value of the resolution of quantizing is determined from a trade-off between the circuit size and the allowed inaccuracy.

Second Embodiment

Next, a second embodiment will be described.

Figure 9:
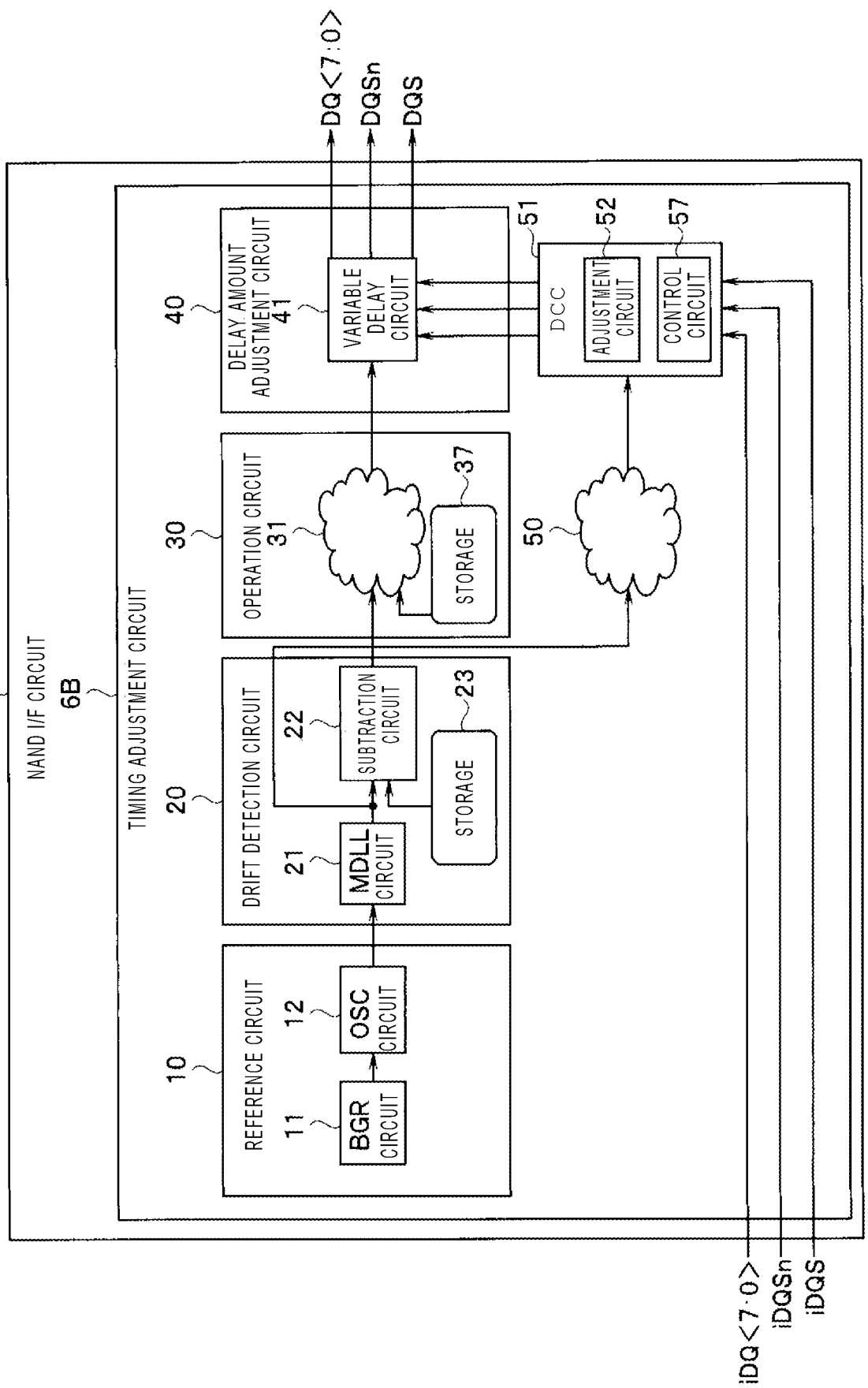
FIG. 9 is a block diagram illustrating a configuration of a timing adjustment circuit according to a second embodiment.

FIG. 9 is a block diagram illustrating a configuration of a timing adjustment circuit according to the second embodiment. In FIG. 9, the same configurations as those in FIG. 2 are designated by the same reference numerals, and descriptions thereof will be omitted.

As illustrated in FIG. 9, compared to the timing adjustment circuit 6A according to the first embodiment, a timing adjustment circuit 6B according to the second embodiment further includes a combination circuit 50 and a duty cycle correction (DCC) circuit 51.

The first code value indicating how many stages of the buffer B in the delay line 25 corresponds to one cycle of the reference clock is input to the combination circuit 50 from the MDLL circuit 21. The combination circuit 50 performs a predetermined operation processing on the first code value from the MDLL circuit 21, for example, the operation processing as in the combination circuit 31, and outputs the operation result to the DCC circuit 51.

The internal data signals iDQ<7:0>, and the internal data strobe signals iDQS and iDQSn are input to the DCC circuit 51. The DCC circuit 51 includes an adjustment circuit 52 and a control circuit 57, and adjusts the duty cycle of the internal data signals iDQ<7:0>, and the internal data strobe signals iDQS and iDQSn with high accuracy based on the operation result from the combination circuit 50. The DCC circuit 51 outputs the internal data signals iDQ<7:0>, and the internal data strobe signals iDQS and iDQSn with the duty cycle adjusted with high accuracy to the delay amount adjustment circuit 40.

The internal data signals iDQ<7:0>, and the internal data strobe signals iDQS and iDQSn with the duty cycle adjusted with high accuracy by the DCC circuit 51 are input to each variable delay circuit 41 of the delay amount adjustment circuit 40. Each variable delay circuit 41 delays each of the internal data signals iDQ<7:0>, and the internal data strobe signals iDQS and iDQSn based on the delay set value from each addition circuit 36 (see FIG. 3) to output to the NAND flash memory 3 as the data signals DQ<7:0>, and the data strobe signals DQS and DQSn.

Figure 10:
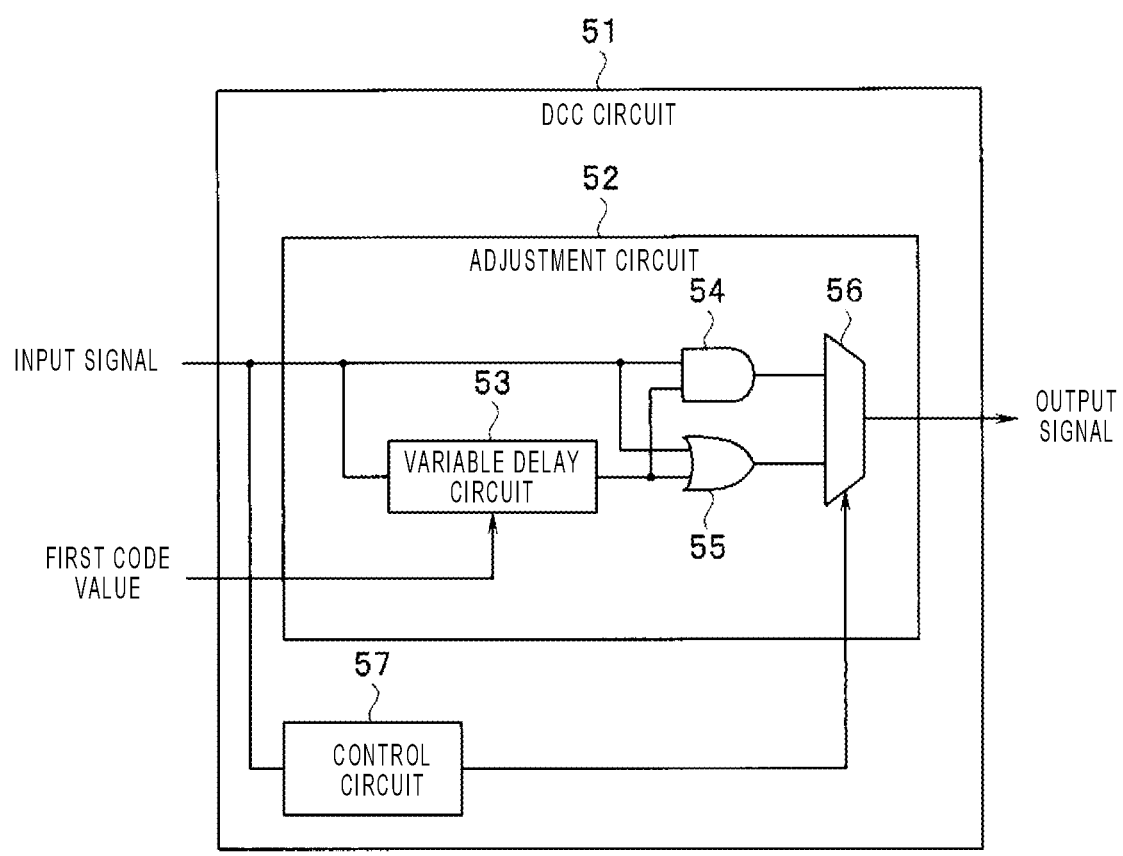
FIG. 10 is a block diagram illustrating a detailed configuration of a duty cycle correction (DCC) circuit according to the second embodiment.

FIG. 10 is a block diagram illustrating a detailed configuration of a duty cycle correction (DCC) circuit according to the second embodiment.

The adjustment circuit 52 includes a variable delay circuit 53, an AND circuit 54, an OR circuit 55, and a selector 56. The input signal is input to the variable delay circuit 53, the AND circuit 54, the OR circuit 55, and the control circuit 57. The first code value is input to the variable delay circuit 53.

The variable delay circuit 53 has the same configuration as the variable delay circuit 41, and includes a selector and a delay line to which a plurality of buffers are connected. The selector selects any one of the input signal or the output of each buffer in the delay line based on the first code value, and outputs the selected signal to the AND circuit 54 and the OR circuit 55.

The AND circuit 54 calculates a logical product of the input signal and the output signal of the variable delay circuit 53, and outputs the calculated result to the selector 56. The OR circuit 55 calculates a logical sum of the input signal and the output signal of the variable delay circuit 53, and outputs the calculated result to the selector 56.

The control circuit 57 detects the pulse width of the input signal, and outputs a selection signal for selecting whether to delay the rising edge of the input signal or the falling edge of the input signal to the selector 56.

The selector 56 is not operated and does not output the output signal until the selection signal is supplied. The selector 56 selects one of the output result of the AND circuit 54 and the output result of the OR circuit 55 based on the selection signal, and outputs the selected one as the output signal. Specifically, when the rising edge of the input signal is delayed according to the selection signal to adjust the duty ratio, the selector 56 selects the output result of the AND circuit 54. Meanwhile, when the falling edge of the input signal is delayed according to the selection signal to adjust the duty ratio, the selector 56 selects the output result of the OR circuit 55.

With this configuration, the timing adjustment circuit 6B can simultaneously perform the drift compensation operation of the timing adjustment of the data signals DQ<7:0>, and the data strobe signals DQS and DQSn, and the drift compensation operation of the duty cycle adjustment.

Third Embodiment

Next, a third embodiment will be described.

Figure 11:
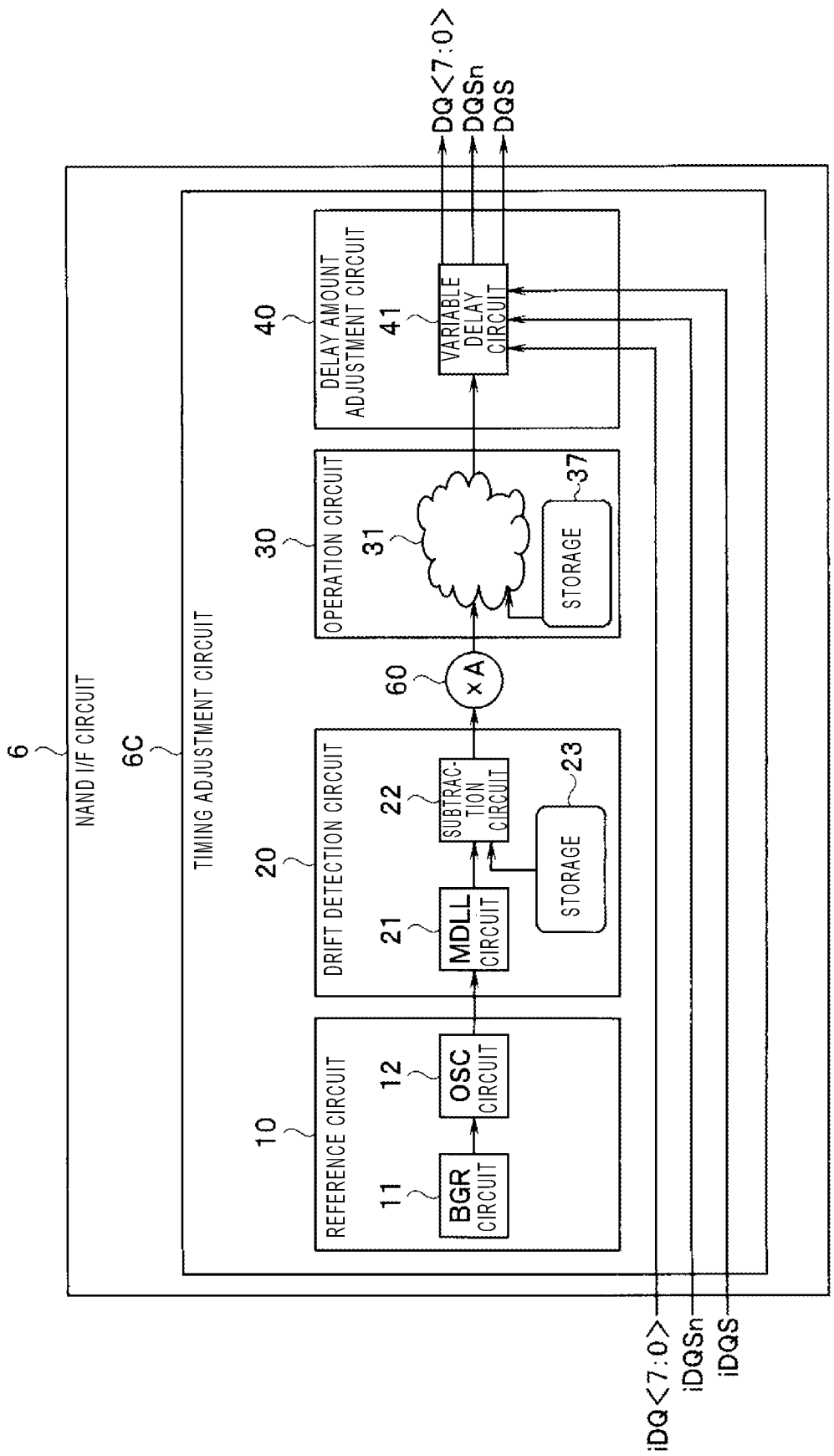
FIG. 11 is a block diagram illustrating a configuration of a timing adjustment circuit according to a third embodiment.

FIG. 11 is a view illustrating a configuration of a timing adjustment circuit according to the third embodiment. In FIG. 11, the same configurations as those in FIG. 2 are designated by the same reference numerals, and descriptions thereof will be omitted.

As illustrated in FIG. 11, compared to the timing adjustment circuit 6A according to the first embodiment, a timing adjustment circuit 6C according to the third embodiment further includes an amplification circuit 60. The amplification circuit 60 is provided between the drift detection circuit 20 and the operation circuit 30, amplifies the drift amount detected by the drift detection circuit 20, and outputs the amplified drift amount to the operation circuit 30.

An amplification amount A of the amplification circuit 60 is determined to match the temperature and voltage dependent change of the NAND flash memory 3 by performing the processing of step S1 described with reference to FIG. 6 at a plurality of temperatures (e.g., 0° C., 30° C., and 85° C.), for example, at the time of test before the shipment of a product. That is, when the NAND flash memory 3 has temperature and voltage dependence, and the optimum delay set value of the variable delay circuit 41 is changed, the output (drift amount) of the drift detection circuit 20 may be amplified using the amplification amount A, so that the optimum delay set value matched to the temperature and voltage dependence of the NAND flash memory 3 can be set.

For example, when A>1, each signal (data signals DQ<7: 0>, and data strobe signals DQS and DQSn) is corrected more strongly than the actual drift amount. In this case, the delay set value input to the variable delay circuit 41 is corrected to have negative temperature and voltage dependence with respect to the drift amount. When A=1, each signal is corrected according to the actual drift amount. In this case, the delay set value input to the variable delay circuit 41 is corrected so as not to have temperature and voltage dependence with respect to the change of the drift amount. When 0<A<1, each signal is corrected more weakly than the actual drift amount. In this case, the delay set value input to the variable delay circuit 41 is corrected to have temperature and voltage dependence weaker than the change in the drift amount. When A=0, each signal is not corrected. In this case, the delay set value input to the variable delay circuit 41 is not related to the change in the drift amount, and is not corrected. When A<0, each signal is reversely corrected. In this case, the delay set value input to the variable delay circuit 41 is corrected to have temperature and voltage dependence stronger than the change in the drift amount.

In this manner, the timing adjustment circuit 6C amplifies the detected drift amount, so that the drift compensation amount has temperature and voltage dependence. As a result, the timing adjustment circuit 6C is capable of correcting the drift amount in consideration of not only the drift amount in the variable delay circuit 41, but also the fluctuation of the drift amount of a peripheral circuit or the inside of the NAND flash memory 3.

In the embodiment, the amplification circuit 60 is used as a circuit for amplifying the drift amount, but the amplification circuit is not limited thereto, and for example, may use an addition circuit. Further, the circuit configuration that gives temperature and voltage dependence to the drift compensation amount is not limited to the configuration in FIG. 11, but may have configurations as illustrated in FIGS. 12 to 14.

Figure 12:
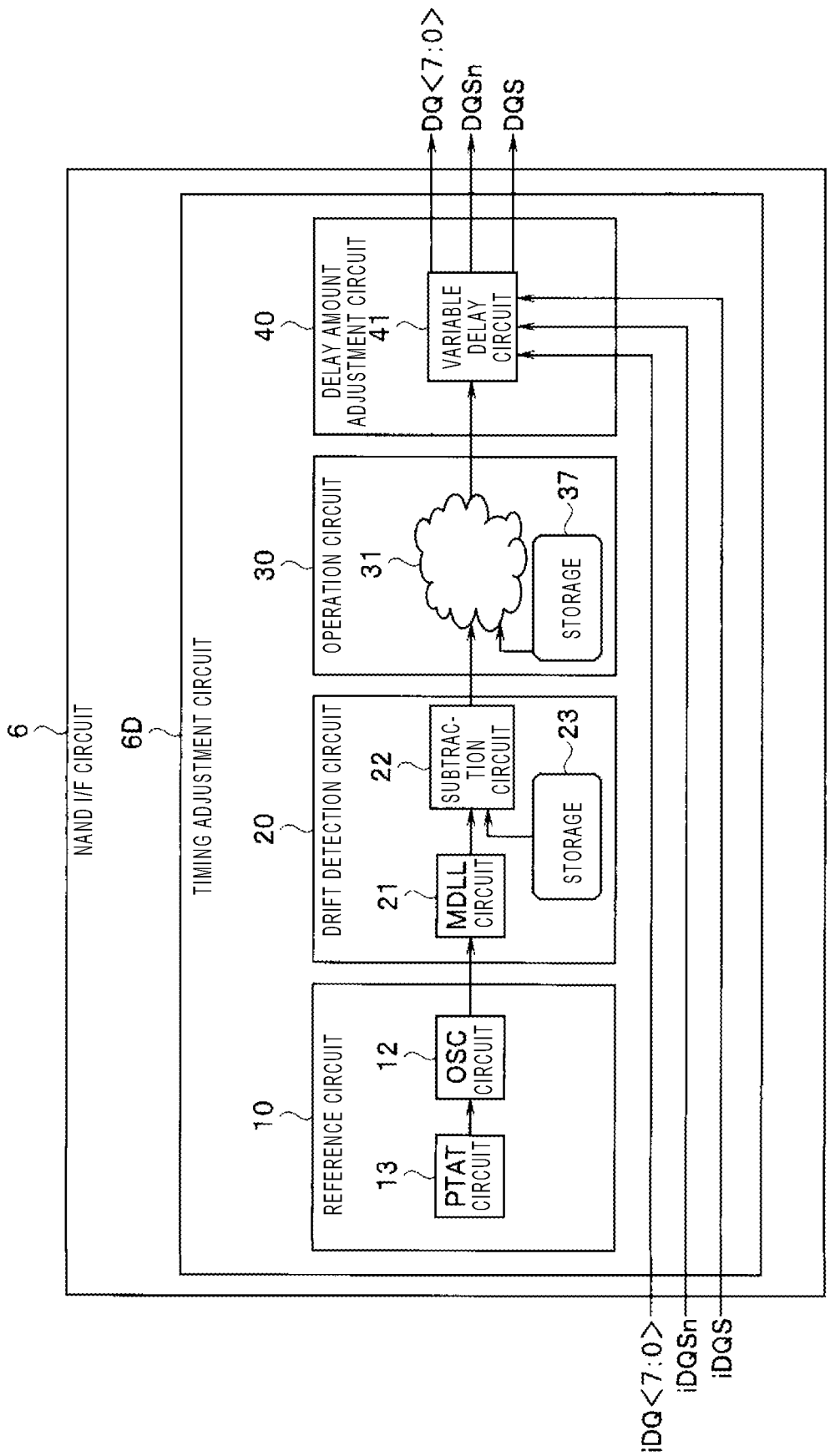
FIG. 12 is a block diagram illustrating a configuration of a timing adjustment circuit according to Modification 1 of the third embodiment.
Figure 13:
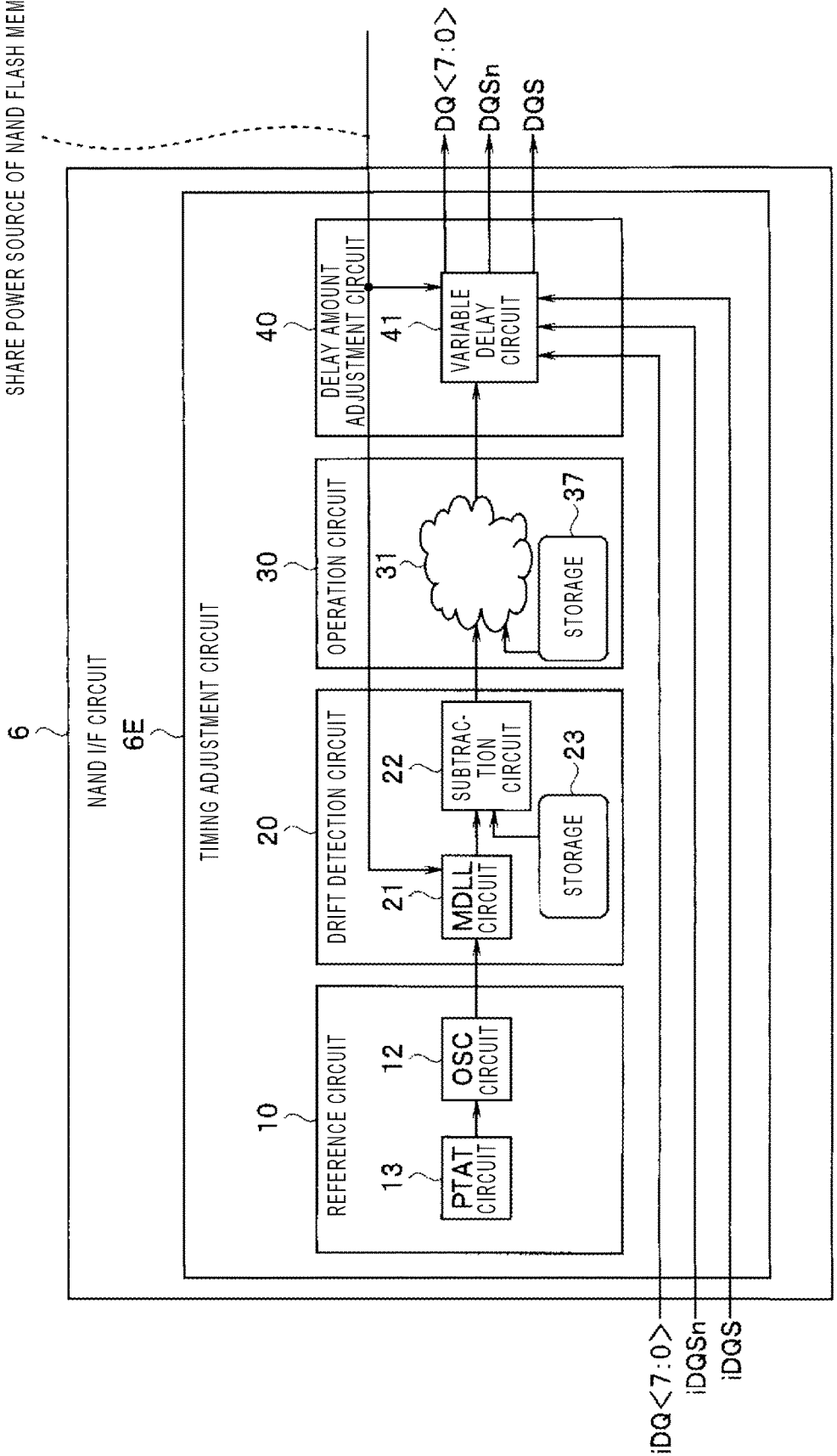
FIG. 13 is a block diagram illustrating a configuration of a timing adjustment circuit according to Modification 2 of the third embodiment.
Figure 14:
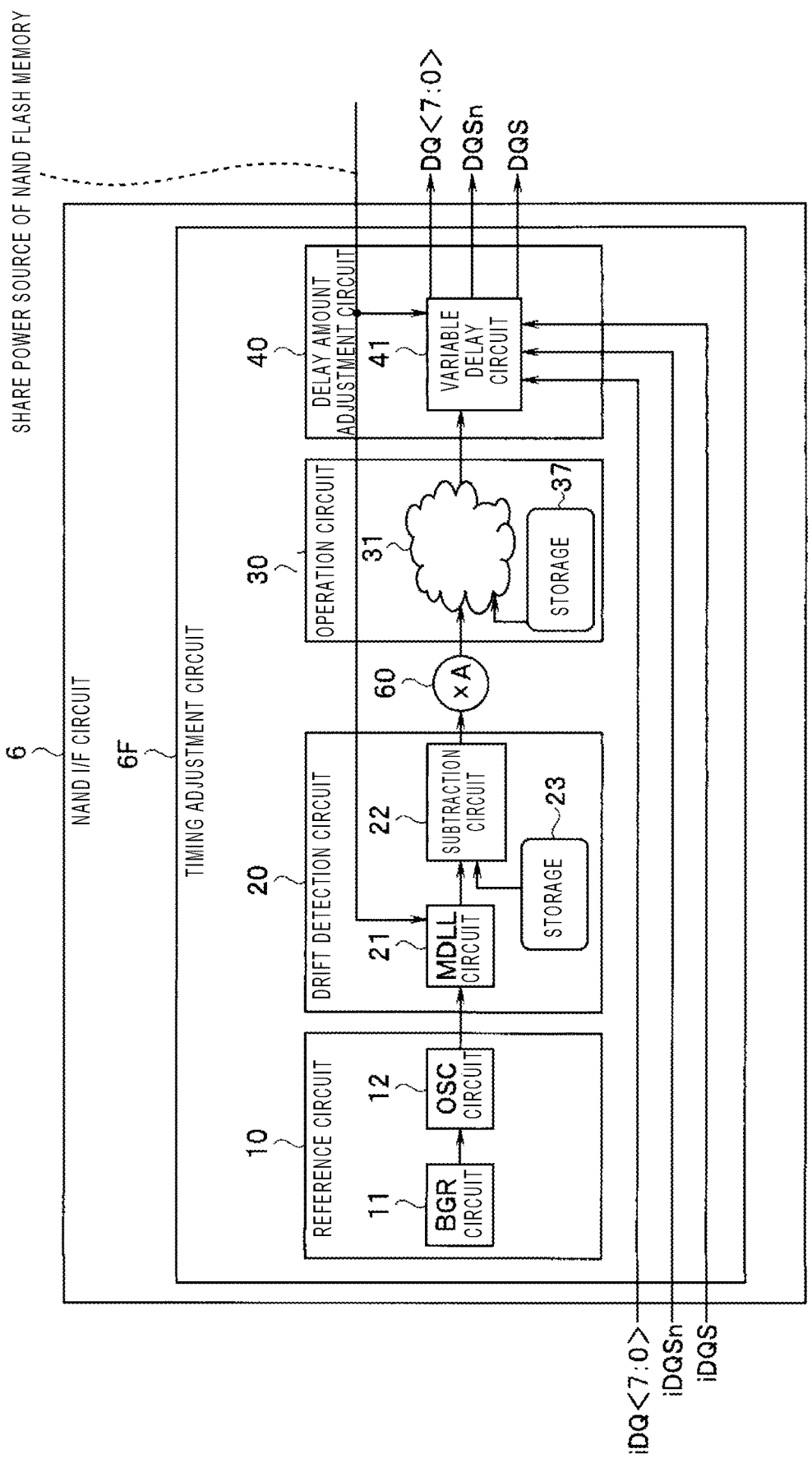
FIG. 14 is a block diagram illustrating a configuration of a timing adjustment circuit according to Modification 3 of the third embodiment.

FIGS. 12 to 14 are block diagrams illustrating other configurations of a timing adjustment circuit that gives temperature and voltage dependence to the drift compensation amount.

[Modification 1]

As illustrated in FIG. 12, a timing adjustment circuit 6D according to Modification 1 uses a proportional to absolute temperature (PTAT) circuit 13 instead of the BGR circuit 11 of the timing adjustment circuit 6A according to the first embodiment.

The PTAT circuit 13 has a characteristic of changing the output voltage in proportion to temperature. That is, the PTAT circuit 13 outputs the output voltage dependent of the temperature of the timing adjustment circuit 6D and the NAND flash memory 3 to the OSC circuit 12. Therefore, the OSC circuit 12 generates a clock having temperature dependence with the voltage changed by the temperature dependence.

The drift detection circuit 20 detects the drift amount with the clock having the temperature dependence. In this manner, the timing adjustment circuit 6D according to Modification 1 can detect the drift amount in consideration of the temperature dependence of the NAND flash memory 3 by using the PTAT circuit 13 dependent of temperature instead of the BGR circuit 11 that is independent of temperature and voltage, and thus, the optimum delay set value that matches the temperature dependence of the NAND flash memory 3 can be set.

[Modification 2]

As illustrated in FIG. 13, a timing adjustment circuit 6E according to Modification 2 has a configuration in which the power sources of the MDLL circuit 21 and the variable delay circuit 41 of the timing adjustment circuit 6D of Modification 1 is shared with the power source of the NAND flash memory 3. That is, the MDLL circuit 21 may detect the drift amount in consideration of the voltage dependence of the NAND flash memory 3. Further, the variable delay circuit 41 may set the optimum delay set value in consideration of the voltage dependence of the NAND flash memory 3.

With this configuration, the timing adjustment circuit 6E can set the optimum delay set value that matches the voltage dependence of the NAND flash memory 3. Further, the timing adjustment circuit 6E can detect the drift amount in consideration of the temperature dependence of the NAND flash memory 3 by using the PTAT circuit 13. As a result, the timing adjustment circuit 6E can set the optimum delay set value that matches the temperature and voltage dependence of the NAND flash memory 3.

[Modification 3]

As illustrated in FIG. 14, a timing adjustment circuit 6F according to Modification 3 has a configuration in which the function of the timing adjustment circuit 6C according to the third embodiment and the function of the timing adjustment circuit 6E according to Modification 2 are combined. That is, compared to the timing adjustment circuit 6E according to Modification 2, the timing adjustment circuit 6F further includes the amplification circuit 60. With this configuration, the timing adjustment circuit 6F can set the optimum delay set value that matches the temperature and voltage dependence of the NAND flash memory 3 as compared with the timing adjustment circuit 6C according to the third embodiment or the timing adjustment circuit 6E according to Modification 2.

Fourth Embodiment

Next, a fourth embodiment will be described.

Figure 15:
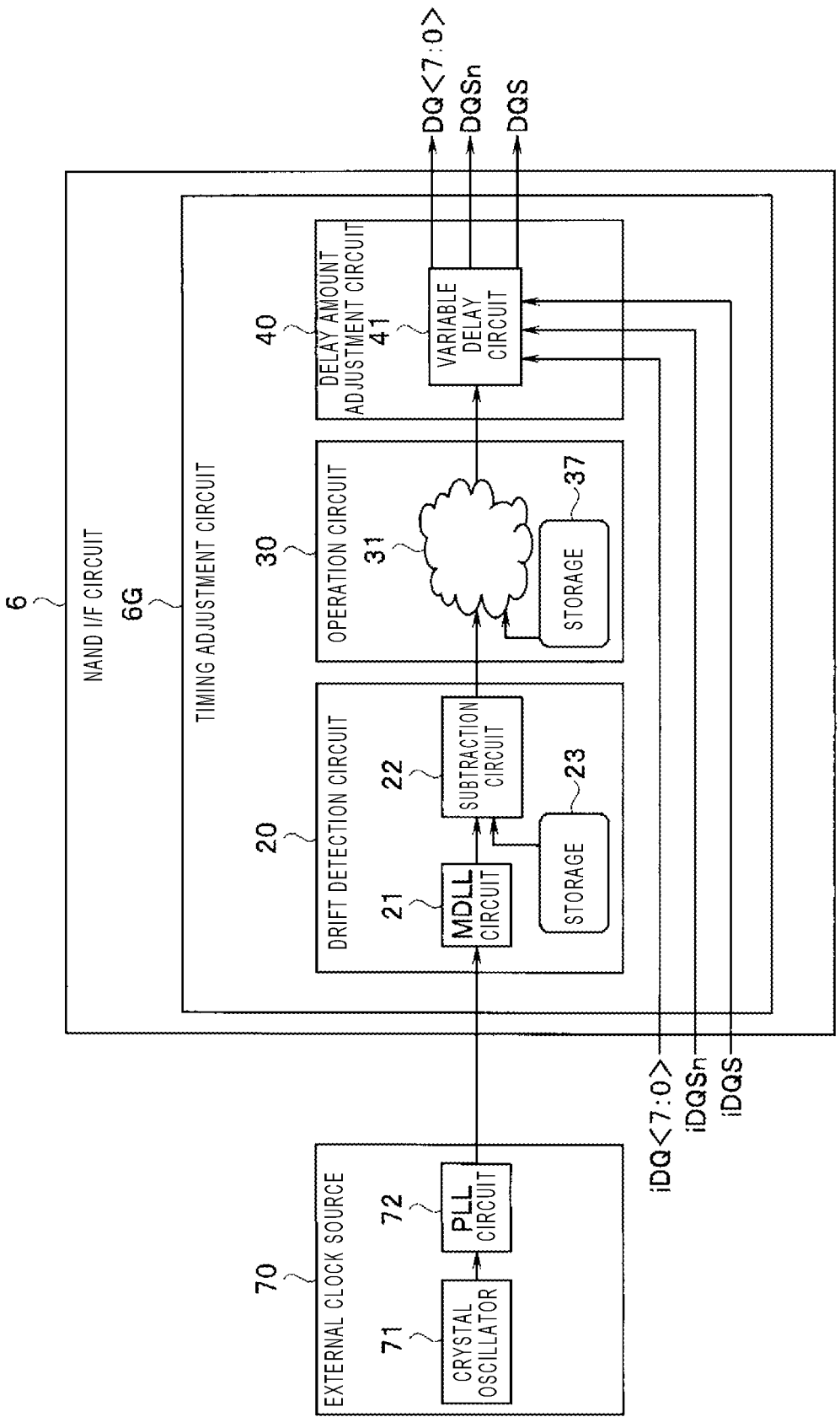
FIG. 15 is a block diagram illustrating a configuration of a timing adjustment circuit according to a fourth embodiment.

FIG. 15 is a block diagram illustrating a configuration of a timing adjustment circuit according to the fourth embodiment. In FIG. 15, the same configurations as those in FIG. 2 are designated by the same reference numerals, and descriptions thereof will be omitted.

As illustrated in FIG. 15, a timing adjustment circuit 6G according to the fourth embodiment has a configuration in which the reference circuit 10 is deleted from the timing adjustment circuit 6A according to the first embodiment. Instead, the reference clock is supplied to the MDLL circuit 21 of the timing adjustment circuit 6G from an external clock source 70. The external clock source 70 includes a crystal oscillator 71 and a PLL circuit 72.

The timing adjustment circuit 6G uses a clock generated by the external clock source 70 including the crystal oscillator 71 having a very high frequency accuracy with respect to a temperature change or the like as a reference clock. Therefore, the temperature and voltage dependence of the reference clock can be reduced.

Fifth Embodiment

Next, a fifth embodiment will be described.

Figure 16:
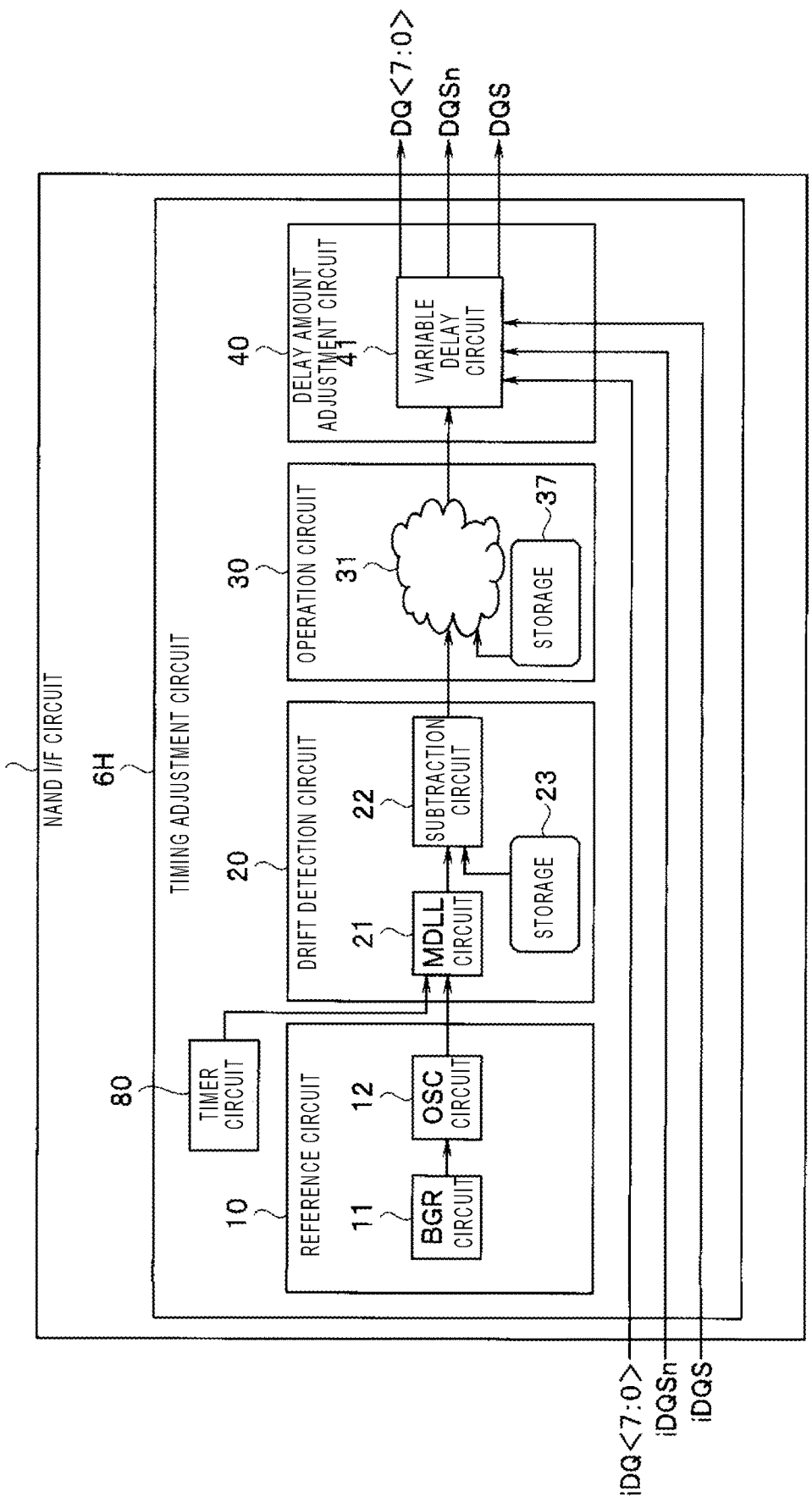
FIG. 16 is a block diagram illustrating a configuration of a timing adjustment circuit according to a fifth embodiment.

FIG. 16 is a block diagram illustrating a configuration of a timing adjustment circuit according to the fifth embodiment. In FIG. 16, the same configurations as those in FIG. 2 are designated by the same reference numerals, and descriptions thereof will be omitted.

As illustrated in FIG. 16, a timing adjustment circuit 6H according to the fifth embodiment has a configuration in which a timer circuit 80 is added to the timing adjustment circuit 6A according to the first embodiment. The timer circuit 80 measures time and outputs a control signal to the MDLL circuit 21 at a predetermined time interval. The MDLL circuit 21 performs the drift amount detection at the predetermined time interval based on the control signal from the timer circuit 80. When the MDLL circuit 21 does not perform the drift amount detection, the operation is stopped.

It is possible to reduce the power consumption by stopping the operation of the MDLL circuit 21 when the MDLL circuit 21 is not performing the drift amount detection. Further, normally, the operation environment is less likely changed dramatically, and thus, the drift amount is also less likely changed dramatically. As a result, the optimum delay amount can be maintained by merely performing the drift compensation operation at a predetermined time interval using the timer circuit 80.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a drift detection circuit configured to retrieve a previously-determined first delay amount of a reference signal passing through a circuit element at a first timing, determine a second delay amount of the reference signal passing through the circuit element at a second timing after the first timing, and output a drift amount that is a difference between the first delay amount and the second delay amount; and
a delay amount adjustment circuit configured to retrieve a previously-determined third delay amount of a first signal transmitted to an external device of the semiconductor device at the first timing, determine a fourth delay amount based on the third delay amount and the drift amount as a delay amount to be applied to the first signal in a period after the second timing, and transmit the first signal to which the fourth delay amount has been applied, to the external device.

2. The semiconductor device according to claim 1, wherein the delay amount adjustment circuit determines a drift compensation amount by multiplying the drift amount by a ratio of the third delay amount to the first delay amount, and determines the fourth delay amount based on the drift compensation amount and the third delay amount.

3. The semiconductor device according to claim 2, wherein the delay amount adjustment circuit determines the fourth delay amount by adding the drift compensation amount and the third delay amount.

4. The semiconductor device according to claim 2, wherein
the drift detection circuit includes a plurality of first delay elements, determines the number of the first delay elements having an aggregate delay amount corresponding to a first cycle of the reference signal at the first timing as a first set value, and determines the number of the first delay elements having an aggregate delay amount corresponding to the first cycle of the reference signal at the second timing as a second set value, and
the delay amount adjustment circuit determines the drift compensation amount based on a first difference value that is a result of a bit-shift operation performed on a difference between the first set value and the second set value.

5. The semiconductor device according to claim 4, wherein
the delay amount adjustment circuit includes a plurality of second delay elements, each of the first and second delay elements having the same delay amount, and
the delay amount adjustment circuit determines the number of the second delay elements having an aggregate delay amount corresponding to the third delay amount as a third set value, and determines the fourth delay amount based on a result of adding the first difference value and the third set value.

6. The semiconductor device according to claim 4, wherein the drift detection circuit determines a shift amount of the bit-shift operation based on a ratio of the third delay amount to the first delay amount.

7. The semiconductor device according to claim 1, wherein
the circuit element is a delay circuit, and
the drift detection circuit generates a reference signal having a first cycle, and determines the first delay amount based on a time period required for the reference signal to pass through a plurality of delay elements in the delay circuit.

8. The semiconductor device according to claim 1, wherein the first delay amount and the third delay amount are determined at time of training.

9. The semiconductor device according to claim 1, further comprising:
a reference circuit configured to generate a reference clock that does not vary as a result of changes in temperature within a first range and changes in voltage within a second range,
wherein the reference clock is supplied to the drift detection circuit as the reference signal.

10. The semiconductor device according to claim 1, further comprising:
a duty cycle adjustment circuit configured to adjust a duty cycle of the first signal based on the drift amount.

11. The semiconductor device according to claim 1, further comprising:
an amplification circuit configured to amplify the drift amount.

12. The semiconductor device according to claim 1, wherein a power source of the drift detection circuit and the delay amount adjustment circuit is shared with a power source of the external device.

13. The semiconductor device according to claim 1, wherein the drift detection circuit determines the drift amount based on a reference clock generated by an external clock source.

14. The semiconductor device according to claim 1, further comprising:
a timer circuit,
wherein the drift detection circuit determines the drift amount at a predetermined time interval based on a control signal generated by the timer circuit at the predetermined time interval.

15. A memory system comprising:
a non-volatile memory; and
a semiconductor device electrically connected to the non-volatile memory and configured to control the non-volatile memory, the semiconductor device including:
a drift detection circuit configured to retrieve a previously-determined first delay amount of a reference signal passing through a circuit element at a first timing, determine a second delay amount of the reference signal passing through the circuit element at a second timing after the first timing, and output a drift amount that is a difference between the first delay amount and the second delay amount; and
a delay amount adjustment circuit configured to retrieve a previously-determined third delay amount of a first signal transmitted to the non-volatile memory at the first timing, determine a fourth delay amount based on the third delay amount and the drift amount as a delay amount to be applied to the first signal in a period after the second timing, and transmit the first signal to which the fourth delay amount has been applied, to the non-volatile memory.

16. The memory system according to claim 15, wherein the first signal is a data signal or a data strobe signal transmitted from the semiconductor device to the non-volatile memory.

17. A method of correcting a signal transmitted from a memory controller to a memory device, said method comprising:
determining a first delay amount of a reference signal passing through a plurality of delay circuits during a training phase;
determining a second delay amount of the reference signal passing through the plurality of delay circuits during a preparation phase after the training phase;
determining a third delay amount of the signal transmitted from the memory controller to the memory device during the training phase;
determining a fourth delay amount based on the third delay amount and a difference between the first delay amount and the second delay amount during the preparation phase; and
during an operational phase after the preparation phase, delaying the signal by the fourth delay amount and transmitting the delayed signal from the memory controller to the memory device.

18. The method of claim 17, wherein the fourth delay amount is determined based on the third delay amount and a drift compensation amount obtained by multiplying the difference between the first delay amount and the second delay amount by a ratio of the third delay amount to the first delay amount.

19. The method of claim 18, wherein the fourth delay amount is determined by adding the third delay amount and the drift compensation amount.

20. The method of claim 17, further comprising:
generating a reference clock that does not vary as a result of changes in temperature within a first range and changes in voltage within a second range,
wherein the reference clock is passed through the plurality of delay circuits as the reference signal.

* * * * *